United States Patent
Tomishima

(10) Patent No.: US 7,177,213 B2
(45) Date of Patent: Feb. 13, 2007

(54) CAPACITOR SUPPORTED PRECHARGING OF MEMORY DIGIT LINES

(75) Inventor: Shigeki Tomishima, Tsukuba (JP)

(73) Assignee: Micron Technology, Inc., Boise, ID (US)

( * ) Notice: Subject to any disclaimer, the term of this patent is extended or adjusted under 35 U.S.C. 154(b) by 2 days.

(21) Appl. No.: 10/958,936

(22) Filed: Oct. 5, 2004

(65) Prior Publication Data
US 2006/0034113 A1 Feb. 16, 2006

(30) Foreign Application Priority Data
Aug. 13, 2004 (JP) .............................. 2004-236245

(51) Int. Cl.
*G11C 7/00* (2006.01)
(52) U.S. Cl. ........................ 365/203; 365/202; 365/149
(58) Field of Classification Search ................ 365/203, 365/202, 149
See application file for complete search history.

(56) References Cited

U.S. PATENT DOCUMENTS

| | | | |
|---|---|---|---|
| 4,855,628 A | 8/1989 | Jun | |
| 4,943,952 A * | 7/1990 | Terayama | ..................... 365/203 |
| 5,856,949 A | 1/1999 | Jiang | |
| 5,982,682 A | 11/1999 | Nevill et al. | |
| 6,094,734 A | 7/2000 | Beffa et al. | |
| 6,154,402 A | 11/2000 | Akita | |
| 6,205,072 B1 | 3/2001 | Jung | |
| 6,281,713 B1 | 8/2001 | Kim | |
| 6,304,505 B1 | 10/2001 | Forbes et al. | |
| 6,657,883 B2 | 12/2003 | Takashima | |
| 2003/0107932 A1 | 6/2003 | Komura | |

FOREIGN PATENT DOCUMENTS

GB 2 314 951 A 1/1998

OTHER PUBLICATIONS

Chun, Ki-Chul et al., "A 1.8 V 128 Mb mobile DRAM with hidden-precharged triple pumping scheme and dual-path hybrid current sense amplifier," *Current Applied Physics* 4, 2004, pp. 25-29.
Vernon, Emerson et al., "Role of supply voltage and load capacitors in the experimental operation of small signal MOSFET amplifiers," *Solid-State Electronics* 45, 2001, pp. 2033-2038.

* cited by examiner

*Primary Examiner*—Huan Hoang
(74) *Attorney, Agent, or Firm*—Fish & Neave IP Group of Ropes & Gray LLP; Jeffrey H. Ingerman; Chia-Hao La

(57) ABSTRACT

Circuits and methods are provided for precharging pairs of memory digit lines. The final precharge voltage of the digit lines is different from the average of the digit line voltages prior to precharging. The final precharge voltage can be set by appropriately selecting the size of a capacitor in the precharge circuit.

30 Claims, 5 Drawing Sheets

CAPACITOR SUPPORTED PRECHARGING OF MEMORY DIGIT LINES

BACKGROUND OF THE INVENTION

This invention relates to integrated circuit memories. More particularly, this invention relates to the precharging of digit lines in dynamic random access memories (DRAMs).

A DRAM is a form of semiconductor random access memory (RAM) commonly used as main memory in computers and other electronic systems. DRAMs store information in arrays of integrated circuit "cells." Information is typically read from and written to these cells using pairs of wires called digit lines.

Each DRAM cell has a capacitor to store a logical bit value and is typically accessed with a single pair of digit lines, referred to herein as DL and /DL. When performing a read operation, DL and /DL are precharged to a certain voltage level. For instance, DL and /DL may be precharged to approximately half the power supply voltage (Vcc/2). Precharging can also be referred to as equalization, because the digit line voltages are pulled to substantially equal levels. One of the digit lines, for example DL, is then connected to a voltage stored by the cell's capacitor. This voltage will be higher or lower than the precharge voltage level, depending upon the value of the data stored in the cell. This cell's voltage will pull the voltage of DL upwards or downwards, again depending on the stored value.

At this point, a sense amplifier circuit may be activated in order to amplify the voltage difference between DL and /DL, resulting in a full rail-to-rail voltage difference. For example, a logical 1 may be indicated by a final DL voltage of approximately Vcc and a final /DL voltage of approximately 0V, or ground (GND). The new voltage level at DL can be used to refresh the contents of the memory cell. Thus, precharging is important not only for read operations, but also for routine refresh operations.

In some implementations, the precharge voltage level may differ significantly from Vcc/2. For instance, the precharge voltage level may be about Vcc/2-0.2V. Several techniques have been developed to handle such different precharge levels. However, most known techniques have shortcomings. For instance, the use of a known bleeder gate to connect a digit line pair to the desired precharge voltage may result in a relatively slow voltage change. Or, use of known dual stage precharge techniques may rely on precise timing adjustments, which are based at least partly on circuit simulation results. This reliance on simulation timing tends to create a less robust design.

In view of the foregoing, it would be desirable to provide circuitry and methods that can efficiently precharge digit lines to a level different than Vcc/2, while avoiding reliance on precise timing adjustments.

SUMMARY OF THE INVENTION

In accordance with this invention, circuitry and methods are provided that can efficiently precharge digit lines to a level different than Vcc/2, while avoiding reliance on precise timing adjustments. A precharge circuit of the invention includes three transistors, a capacitor, and a pair of complementary signal lines (designated PRE and /PRE). The circuit is preferably connected to sense amplification circuitry.

Precharging begins with one side of the capacitor being connected to a source of relatively low voltage, such as GND. This connection is made by applying a suitable voltage to the first transistor's gate. The capacitor is then disconnected from the source of relatively low voltage and connected substantially simultaneously to the digit line pair. In one embodiment, the capacitor is connected to GND by applying a high voltage to signal line /PRE, while disconnection occurs by applying a low voltage to signal line /PRE. In addition, the digit lines are connected to the capacitor and to each other by applying a high voltage to signal line PRE.

When the digit lines are connected to the capacitor and to each other, they will settle to substantially the same voltage. However, although DL and /DL usually have values of approximately Vcc and 0V, the digit line precharge voltages will not settle to about Vcc/2. Advantageously, because the lines are also connected to the capacitor of the inventive precharge circuit, which holds a relatively low voltage, the precharge voltage is forced to a lower level. Thus, both digit lines can be precharged to a value lower than Vcc/2.

The exact precharge voltage level will depend on the voltage stored in the capacitor and the initial voltages of DL and /DL, as well as the respective capacitances of the digit lines and the size of the capacitor. Ultimately, the final precharge voltage is determined by the size of the capacitor.

The invention advantageously precharges digit lines to a voltage level different than Vcc/2, while avoiding reliance on precise timing adjustments. The invention relies on a relatively small amount of circuitry, and the voltage change occurs relatively quickly. Because precharging is necessary for refresh operations, which are performed on a recurring basis in a DRAM system, overall system performance and reliability can be significantly improved.

BRIEF DESCRIPTION OF THE DRAWINGS

The above and other objects and advantages of the invention will be apparent upon consideration of the following detailed description, taken in conjunction with the accompanying drawings, in which like reference characters refer to like parts throughout, and in which.

DETAILED DESCRIPTION OF THE INVENTION

Figure 1:
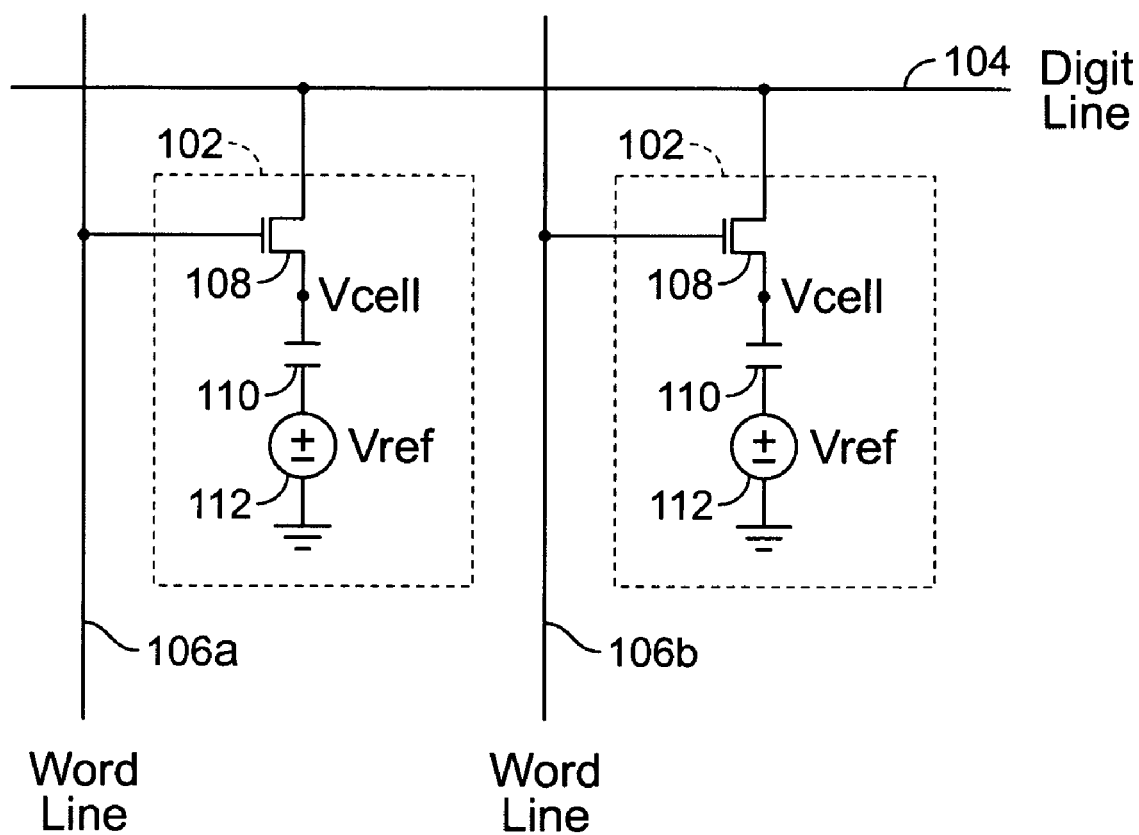
FIG. 1 is a circuit diagram of typical DRAM cells.

DRAMs are, in their simplest form, arrays of cells each including (1) a capacitor for holding a charge and (2) a transistor acting as a switch for accessing the charge held in the capacitor. DRAM arrays are typically arranged in columns and rows. FIG. 1 shows a pair of DRAM cells 102. Each cell 102 is connected to a digit line 104 and a respective word line 106a or 106b that controls the ON/OFF state of transistor 108. Digit line 104 is used to write information to or read information from capacitor 110 when the signal on word line 106a or 106b turns transistor 108 ON (i.e., renders the transistor conductive).

A memory cell's data is stored in capacitor 110. One plate of capacitor 110 is tied to voltage source 112, which generates a voltage of value Vref. In one implementation, Vref may be approximately Vcc/2 for all cells 102. The other plate of capacitor 110 is tied to node Vcell, whose voltage value varies according to the data stored in the cell. For instance, a cell storing a logical 1 may have a Vcell voltage of approximately Vcc, resulting in a voltage of about +Vcc/2 across capacitor 110. Inversely, a cell storing a logical 0 may have a Vcell voltage of approximately 0V, resulting in a voltage of about −Vcc/2 across capacitor 110. The charge stored in capacitor 110 often leaks away over time, resulting in a need to periodically refresh the contents of DRAM cells.

Many DRAM systems use a pair of digit lines, referred to as DL and /DL, to access data in a memory cell. When a read operation is performed, DL and /DL are both precharged to Vref. Transistor 108 is then activated for each memory cell of interest, connecting node Vcell to digit line DL. If Vcell represents a logical 1, then the voltage on DL will be driven up to a value greater than Vref. If Vcell represents a logical 0, then the voltage on DL will be driven down to a value lower than Vref. A sense amplifier will then push the higher voltage to Vcc and the lower voltage to 0V (GND), resulting in a full rail-to-rail voltage difference indicative of the value in that particular cell. The strong final voltage on line DL can also be used to refresh the contents of the memory cell in question.

The precharging operation described above is straightforward when Vref is substantially equal to Vcc/2. After each read or write operation, one of DL and /DL will contain a voltage of Vcc and the other will contain a voltage of 0V. In order to precharge DL and /DL in anticipation of a read or refresh operation, DL and /DL simply have to be disconnected from all power supplies, then connected to each other. Charge sharing ensures that the two voltages will settle to a voltage midpoint, in this case roughly Vcc/2.

In practice, Vref is sometimes set to a voltage that is different from Vcc/2. For instance, Vref may be lower than Vcc/2. This lower precharge voltage helps mitigate the effect of current leakage from cells during periods of inactivity. That is, if Vcell has a relatively high voltage, that voltage will tend to decrease over time unless the cell is refreshed. If the Vcell voltage decreases significantly (e.g., approaching Vcc/2), having a precharge voltage of Vcc/2 may result in data corruption. Thus, using a precharge voltage lower than Vcc/2 reduces the chance that current leakage will result in the reading of an incorrect logical value. Note, however, that using a precharge voltage significantly lower than Vcc/2 requires more complex circuit structures for precharging DL and /DL.

Figure 2A:
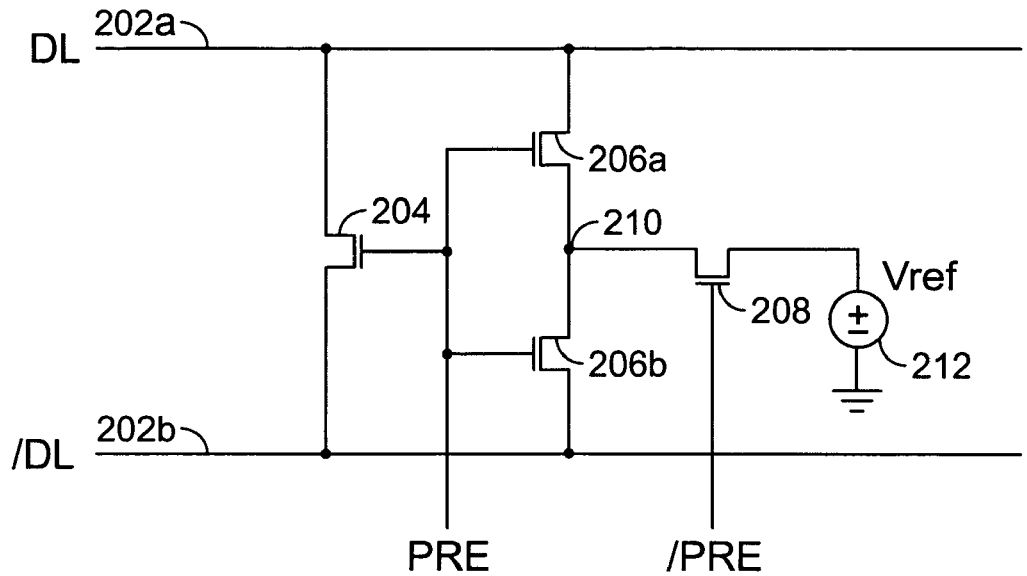
FIG. 2A is a circuit diagram of a typical bleeder gate precharge circuit.

FIG. 2A shows one example of a known precharge circuit, which employs a bleeder gate 208. Digit lines 202a and 202b carry signals DL and /DL to and from the associated memory cell. NMOS transistor 204 connects digit line 202a to 202b when activated. NMOS transistors 206a and 206b connect digit lines 202a and 202b to node 210 when activated. Finally, NMOS transistor 208 connects node 210 to voltage source 212 when activated. Voltage source 212 generates a voltage of value Vref. The gates of NMOS transistors 204, 206a, and 206b receive input signal PRE, while the gate of NMOS transistor 208 receives input signal /PRE.

Figure 2B:
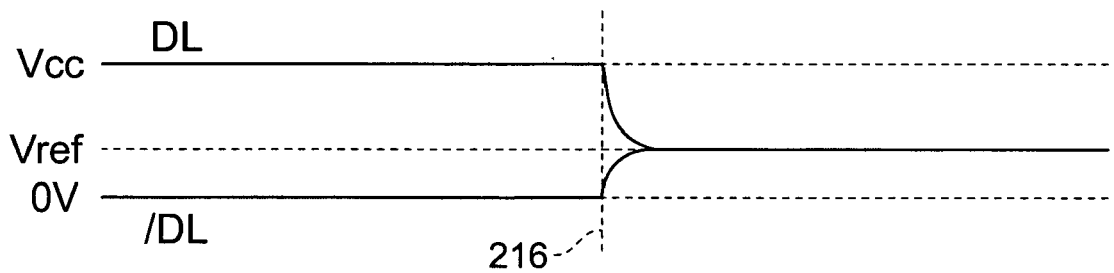
FIG. 2B is a timing diagram of signals in the bleeder gate precharge circuit of FIG. 2A.
Figure 2B:
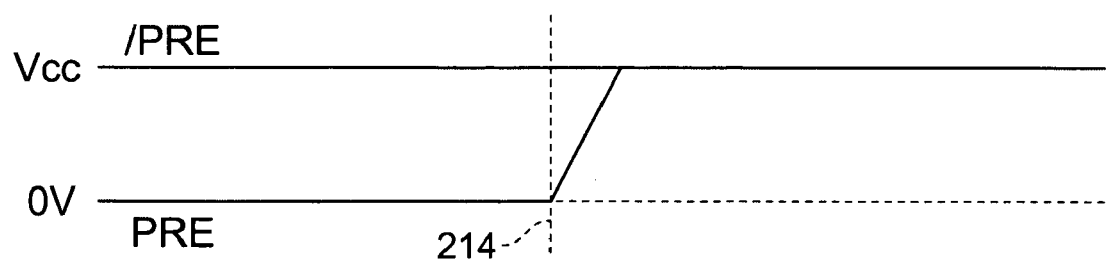

FIG. 2B is a timing diagram showing an illustrative precharge operation using the bleeder gate circuitry of FIG. 2A. Digit line voltages DL and /DL are initially Vcc and 0V, respectively, while signals /PRE and PRE are set to Vcc and 0V, respectively. Thus, NMOS transistor 208 is conductive and node 210 is tied to voltage source 212, while NMOS transistors 204, 206a, and 206b are non-conductive. At time 214, signal PRE goes high. As a result, NMOS transistors 204, 206a, and 206b turn on (i.e., become conductive), connecting digit lines 202a and 202b to each other and to node 210. Thus, signals DL and /DL begin equalizing at time 216 to voltage Vref, which may be substantially different from Vcc/2.

This bleeder gate approach effectively precharges both digit lines to Vref. Unfortunately, the approach is also relatively slow. Voltage Vref must travel through the Vref power bus and through bleeder gate 208 before reaching the digit lines. This potentially long path can result in a lengthy precharge delay.

Figure 3A:
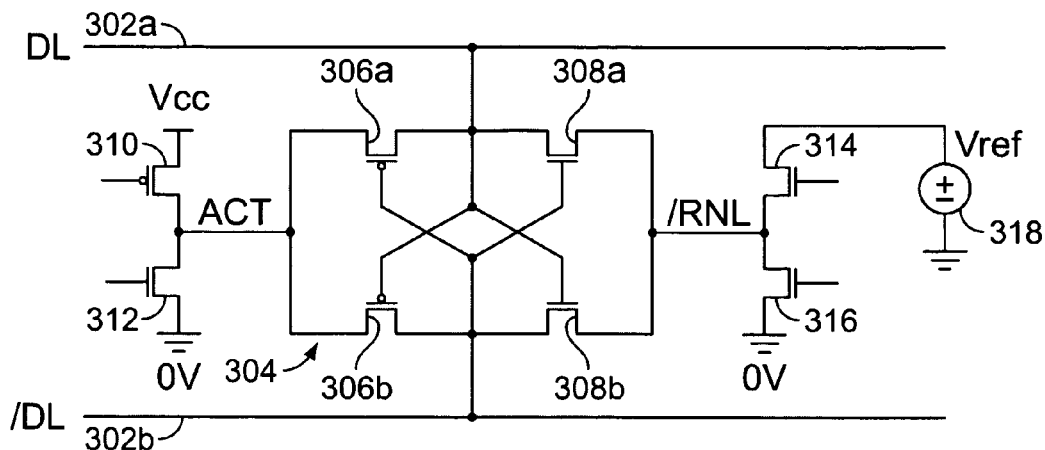
FIG. 3A is a circuit diagram of a typical dual stage precharge circuit.

FIG. 3A shows another known circuit that may be used to precharge a digit line pair to a voltage different than Vcc/2. Digit lines 302a and 302b are connected to sense amplifier 304. Sense amplifier 304 includes PMOS transistors 306a and 306b and NMOS transistors 308a and 308b. The sources of PMOS transistors 306a and 306b are tied to each other and node ACT. Node ACT may be tied to voltage Vcc by PMOS transistor 310 (when conductive) or to 0V by transistor 312 (when conductive). Similarly, the sources of NMOS transistors 308a and 308b are tied to each other and node /RNL. Node /RNL may be tied to voltage source 318 by PMOS transistor 314 (when conductive) or to 0V by NMOS transistor 316 (when conductive). Voltage source 318 generates a voltage of value Vref.

Figure 3B:
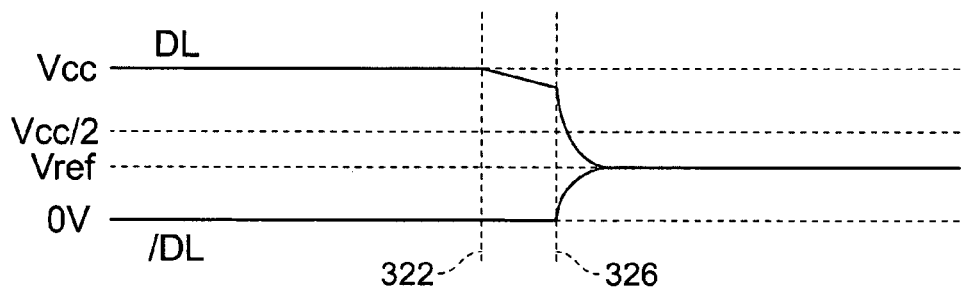
FIG. 3B is a timing diagram of signals in the dual stage precharge circuit of FIG. 3A.
Figure 3B:
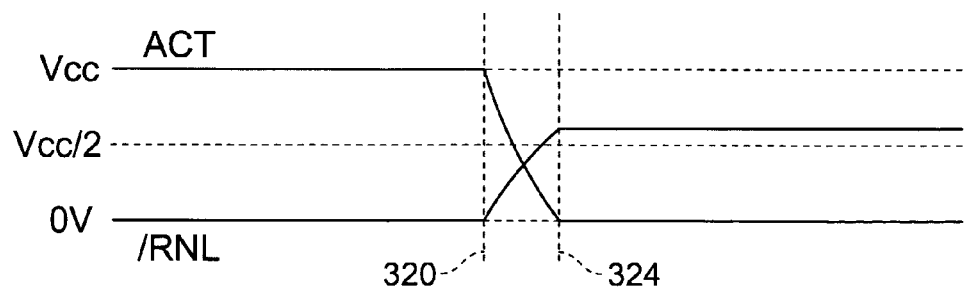

FIG. 3B is a timing diagram showing an illustrative precharge operation using the circuitry of FIG. 3A. The precharge operation involves two stages. Initially, DL has a value of about Vcc and /DL has a value of about 0V. Because the sense amplifier is active at this time, node ACT is about Vcc and node /RNL is about 0V. The first stage of precharging begins at time 320, when the voltage at node ACT is pulled down to 0V and the voltage at node /RNL is pulled partially towards Vcc. In response to these transitions, signal DL begins to drop at time 322. The second stage of precharging begins at time 324, when the voltages at nodes ACT and /RNL are held constant. At time 326, digit lines 302a and 302b are connected to each other, and voltages DL and /DL start to equalize to roughly halfway between their previous voltages. Because DL is allowed to drop below Vcc before the shorting occurs, DL and /DL settle to a voltage slightly below Vcc/2.

The final voltage to which DL and /DL settle depends on the extent to which the high voltage decreases between times 322 and 326, which in turn depends on how high the /RNL node voltage rises between times 320 and 324. In order to ensure an accurate precharge voltage, the timing of the first stage should be set very carefully. Often, the timing parameters are based on measurements from circuit simulations, which may or may not be accurate. Thus, this dual-stage precharge technique, though relatively fast, is relatively difficult to configure reliably.

Figure 4A:
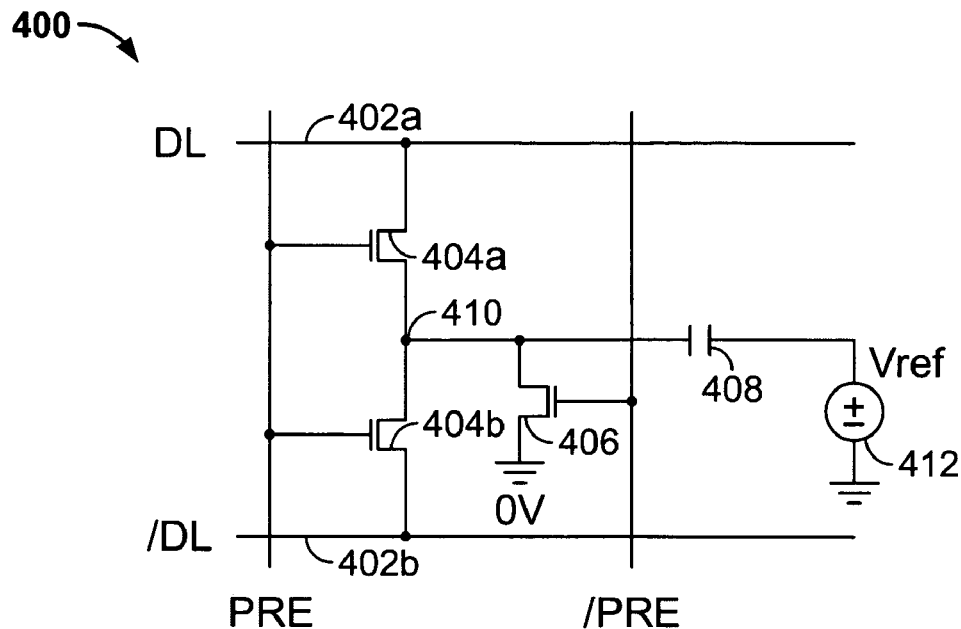
FIG. 4A is a circuit diagram of a capacitor supported precharge circuit according to the invention.

FIG. 4A shows an illustrative precharge circuit 400 according to the invention. Digit lines 402a and 402b are connected to each other by NMOS transistors 404a and 404b, as well as to node 410. NMOS transistor 406 connects node 410 to 0V when active. Capacitor 408 has one plate connected to node 410 and the other plate tied to voltage source 412, which generates a voltage of value Vref. Signal PRE drives the gate of NMOS transistors 404a and 404b, while signal /PRE drives the gate of NMOS transistor 406.

Figure 4B:
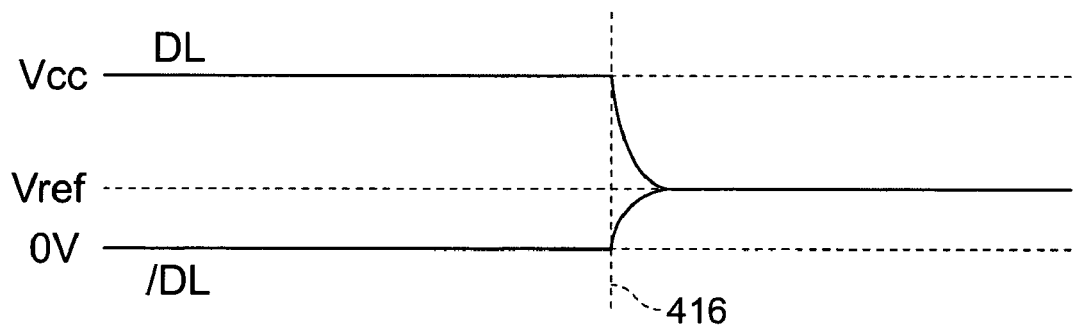
FIG. 4B is a timing diagram of signals in the capacitor supported precharge circuit according to the invention.
Figure 4B:
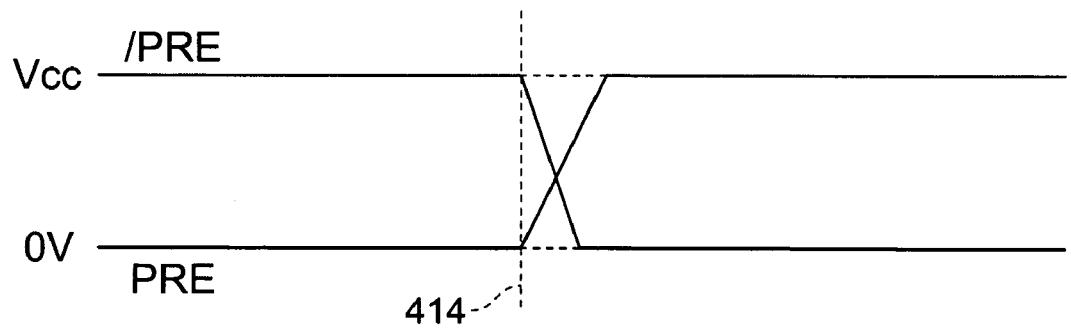

FIG. 4B is a timing diagram showing an illustrative precharge operation according to the invention. Initially, DL and /DL are at voltages Vcc and 0V, respectively, while /PRE and PRE are at voltages Vcc and 0V, respectively. Thus, NMOS transistor 406 is conductive and connects node 410 to 0V. One plate of capacitor 408 therefore has a voltage of 0V, while the other plate has a voltage of Vref. Transistors 404a, 404b, and 406 are non-conductive. At time 414, /PRE goes low while PRE goes high, rendering NMOS transistor 406 non-conductive while substantially simultaneously rendering NMOS transistors 404a and 404b conductive. Because digit lines 402a and 402b are now connected to each other, at time 416 they start converging to the same voltage. However, because they are also connected to node 410, DL and /DL will not converge to Vcc/2. Rather, they will converge to a voltage less than Vcc/2, which in this case is Vref.

The exact amount by which the final voltage of DL and /DL differ from Vcc/2 depends on various factors. The equation below illustrates the relationship between the capacitances and voltages of FIG. 4A.

$$\frac{C_{DL} * V_{DL} + (C_{/DL} + C_{408}) * V_{410}}{C_{DL} + C_{/DL} + C_{408}} = Vref$$

where $C_{DL}$ is the parasitic capacitance of digit line 402a, $V_{DL}$ is the voltage of digit line 402a before equalization, $C_{/DL}$ is the parasitic capacitance of digit line 402b, $C_{408}$ is the capacitance of capacitor 408, $V_{410}$ is the voltage of node 410, and Vref is the target precharge voltage.

Using this equation, the capacitance of capacitor 408 can be determined. Note that the voltage generated by voltage supply 412 could be a value other than Vref. In fact, it may be preferable to use a voltage that is higher than Vref, so that a smaller capacitance $C_{408}$ could be used.

Effective precharging thus can be achieved by simply sizing capacitor 408 appropriately, which is much more robust than relying on timing simulations, as in the dual-stage precharge technique of FIGS. 3A and 3B. Furthermore, the technique illustrated in FIGS. 4A and 4B allows faster equalization of lines DL and /DL than the approach shown in FIGS. 2A and 2B.

The invention advantageously provides a simple, robust, and effective way to precharge pairs of digit lines to a voltage other than Vcc/2. The precharge circuitry is small, requiring few circuit elements, and operates quickly. In addition, the final precharge voltage is easy to set by selecting the size of capacitor 408.

Note that the embodiment shown in FIGS. 4A and 4B and described herein is merely illustrative. Other variations are possible. For instance, the NMOS transistors in FIG. 4A could be replaced by a combination of PMOS and NMOS transistors. Also, the roles of DL and /DL in FIG. 4B could be reversed without affecting the final outcome of the operation. In addition, different types of capacitors could be used for capacitor 408, such as an anti-fuse capacitor or a MOS capacitor. Although the invention has been described in the context of precharging memory digit lines, it can be used to equalize the voltages of other pairs of conductive lines.

Figure 5:
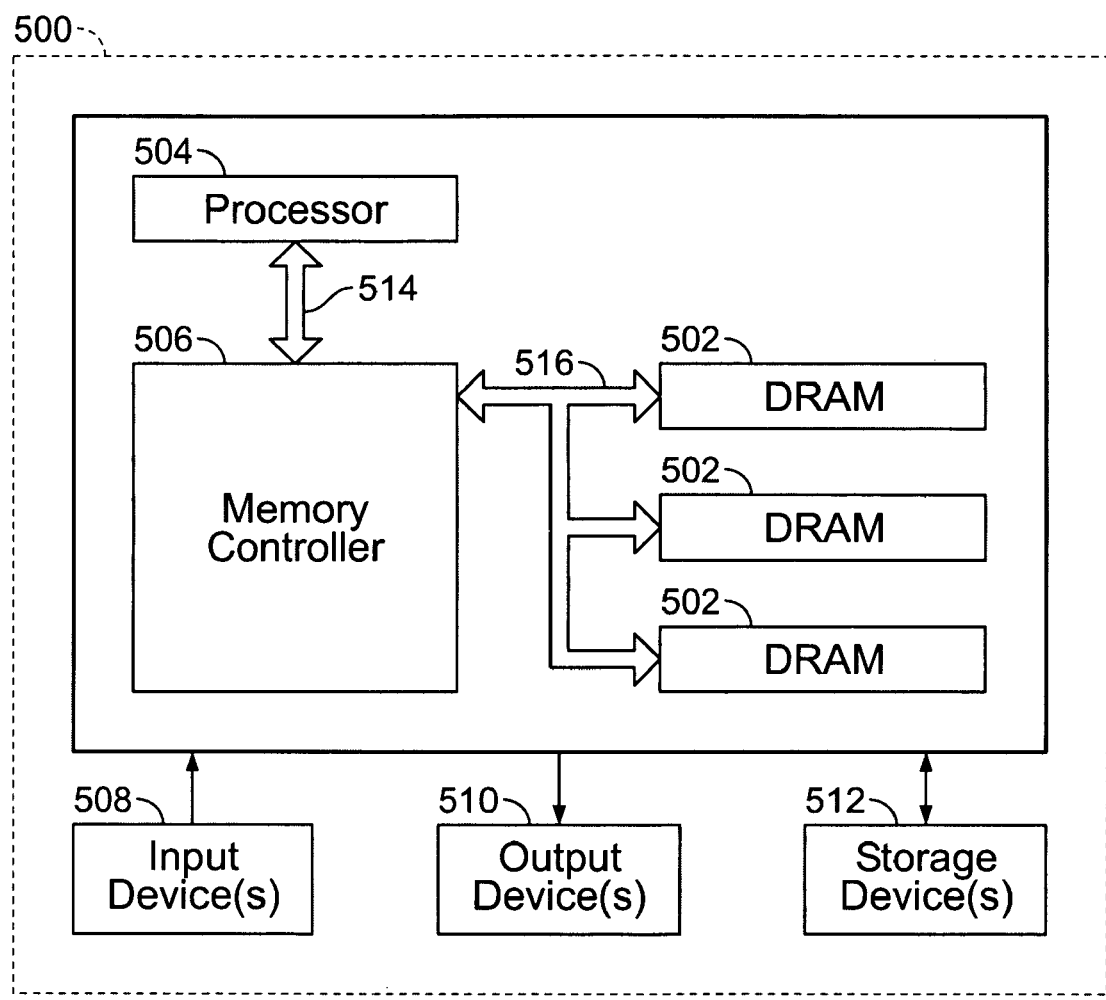
FIG. 5 is a block diagram of a system incorporating the invention.

FIG. 5 shows a system that incorporates the invention. System 500 includes a plurality of DRAM chips 502, a processor 504, a memory controller 506, input devices 508, output devices 510, and optional storage devices 512. DRAM chips 502 include a capacitor supported precharge circuit (e.g., circuit 400) according to the invention. This circuit precharges pairs of digit lines to a voltage different than Vcc/2, which increases the memory's tolerance to current leakage. Data and control signals are transferred between processor 504 and memory controller 506 via bus 514. Similarly, data and control signals are transferred between memory controller 506 and DRAM chips 502 via bus 516. Input devices 508 can include, for example, a keyboard, a mouse, a touch-pad display screen, or any other appropriate device that allows a user to enter information into system 500. Output devices 510 can include, for example, a video display unit, a printer, or any other appropriate device capable of providing output data to a user. Note that input devices 508 and output devices 510 can alternatively be a single input/output device. Storage devices 512 can include, for example, one or more disk or tape drives.

Thus it is seen that circuits and methods are provided for precharging pairs of digit lines to a voltage different than Vcc/2. One skilled in the art will appreciate that the invention can be practiced by other than the described embodiments, which are presented for purposes of illustration and not of limitation, and the present invention is limited only by the claims which follow.

I claim:

1. A circuit for setting a same voltage on each of a plurality of conducting lines, said circuit comprising:
   a capacitor having first and second terminals, said first terminal coupled to a node and said second terminal coupled to a first source of constant voltage;
   a first switching device coupled in series between said node and a second source of constant voltage, wherein said second source of constant voltage has a voltage lower than that of said first source of constant voltage; and
   at least a second switching device coupled between said conducting lines and said node.

2. The circuit of claim 1 wherein:
   said first switching device is operative to connect said node to said second source of constant voltage in response to receiving a first control signal; and
   said second switching device is operative to connect said plurality of conducting lines to said node in response to receiving a second control signal.

3. The circuit of claim 2 wherein said first control signal and said second control signal have substantially opposite logical values.

4. The circuit of claim 2 wherein:
   said second switching device comprises two transistors; and
   said second control signal is coupled to the gates of said two transistors.

5. The circuit of claim 1 wherein said same voltage is not equal to the average of voltages on said conducting lines before said same voltage is set.

6. The circuit of claim 1 wherein said first switching device comprises a transistor.

7. A method of setting a same voltage on each of a plurality of conducting lines, said method comprising:
   connecting via a first switch a first terminal of a capacitor to a first source of constant voltage to allow said capacitor to charge to a desired voltage value, wherein a second terminal of said capacitor is coupled to a second source of constant voltage whose voltage is higher than that of said first source of constant voltage;
   disconnecting via said first switch said first terminal of said capacitor from said first source of constant voltage; and
   connecting via at least one other switch said plurality of conducting lines to said first terminal of said capacitor.

8. The method of claim 7 wherein said same voltage is not equal to the average of the voltages on said conducting lines before said connecting said plurality of conducting lines to said capacitor.

9. The method of claim 7 wherein said disconnecting said capacitor from said source of constant voltage and said connecting said plurality of conducting lines to said capacitor occur substantially simultaneously.

10. A method of setting a same voltage on each of a pair of conducting lines, said method comprising:
   setting a first voltage on a first conducting line;
   setting a second voltage not equal to said first voltage on a second conducting line;
   coupling a first terminal of a capacitor to a first source of constant voltage, wherein a second terminal of said capacitor is coupled to a second source of constant voltage whose voltage is higher than that of said first source of constant voltage;
   coupling said first and second lines to each other and to said first terminal of said capacitor; and
   pulling said first and second voltages to a predetermined value, wherein said predetermined value is not equal to the average of said first and second voltages.

11. The method of claim 10 wherein said predetermined value is less than the average of said first and second voltages.

12. The method of claim 10 wherein said first voltage and said second voltage have substantially opposite logical values.

13. The method of claim 10 wherein said setting a first voltage and said setting a second voltage comprise activating a sense amplifier.

14. The method of claim 10 wherein said coupling said first and second lines to each other and to said first terminal of said capacitor is done via at least one switching device.

15. The method of claim 10 wherein said coupling said first and second lines to each other and to said first terminal of said capacitor comprises activating two transistors coupled in series between said first conducting line and said second conducting line.

16. The method of claim 10 wherein said coupling said first and second lines to each other and to said first terminal of said capacitor comprises coupling said first conducting line and said second conducting line to the same node.

17. The method of claim 16 further comprising setting the voltage of said node to a fixed value.

18. The method of claim 17 wherein said fixed value is lower than said predetermined value.

19. The method of claim 10 further comprising determining a size of a capacitor so as to provide said predetermined value.

20. A dynamic random access memory (DRAM) comprising:
   a plurality of cells, each cell comprising a precharge circuit, wherein the precharge circuit comprises:
   a capacitor having first and second terminals, said first terminal coupled to a node and said second terminal coupled to a first source of constant voltage;
   a first switching device coupled in series between said node and a second source of constant voltage, wherein said second source of constant voltage has a voltage lower than that of said first source of constant voltage; and
   at least one other switching device coupled between a pair of conducting lines and said node.

21. The DRAM of claim 20 further comprising a plurality of sense amplifiers coupled respectively to said plurality of cells.

22. The DRAM of claim 20 wherein:
   said at least one switching device comprises two transistors;
   gates of said transistors are coupled to each other; and
   said gates are coupled to a first control signal line.

23. The DRAM of claim 22 wherein:
   said first switching device is a transistor whose gate is coupled to a second control signal line; and
   voltages of said first and second control signal lines have substantially opposite logical values.

24. A system comprising:
   a processor;
   a memory controller coupled to said processor; and
   a memory coupled via a plurality of conducting lines to said memory controller, said memory comprising:
   a plurality of cells, each cell comprising a precharge circuit, wherein said precharge circuit comprises:
   a capacitor having first and second terminals, said first terminal coupled to a node and said second terminal coupled to a first source of constant voltage;
   a first switching device coupled in series between said node and a second source of constant voltage, wherein said second source of constant voltage has a voltage lower than that of said first source of constant voltage; and
   at least one other switching device coupled between a pair of said conducting lines and said node.

25. The system of claim 24 wherein said conducting lines transfer data between said memory controller and said memory.

26. The system of claim 24 wherein said memory comprises a dynamic random access memory.

27. A circuit for setting a same voltage on each of a plurality of conducting lines, said circuit comprising:
   a first transistor coupled between a first conducting line and a node;
   a second transistor coupled between a second conducting line and said node;
   a capacitor coupled between said node and a first source of constant voltage; and
   a third transistor coupled between said node and a second source of constant voltage, wherein said first source of constant voltage has a voltage higher than said second source of constant voltage.

28. The circuit of claim 27 further comprising:
   a first control signal line coupled to the gates of said first and second transistors; and
   a second control signal line coupled to the gate of said third transistor.

29. A circuit for setting a same voltage on each of a plurality of conducting lines, said circuit comprising:
   means for connecting a first terminal of a capacitor to a first source of constant voltage to allow said capacitor to charge to a desired voltage value, wherein a second terminal of said capacitor is coupled to a second source of constant voltage whose voltage is higher than that of said first source of constant voltage;
   means for disconnecting said first terminal of said capacitor from said first source of constant voltage; and
   means for connecting said plurality of conducting lines to said first terminal of said capacitor.

30. A circuit for setting a same voltage on each of a plurality of conducting lines, said circuit comprising:
- means for setting a first voltage on a first conducting line;
- means for setting a second voltage not equal to said first voltage on a second conducting line;
- means for coupling a first terminal of a capacitor to a first source of constant voltage, wherein a second terminal of said capacitor is coupled to a second source of constant voltage whose voltage is higher than that of said first source of constant voltage;
- means for coupling said first and second lines to each other and to said first terminal of said capacitor; and
- means for pulling said first and second voltages to a predetermined value, wherein said predetermined value is not equal to the average of said first and second voltages.

* * * * *